(12) United States Patent
Jeong et al.

(10) Patent No.: US 11,856,816 B2
(45) Date of Patent: Dec. 26, 2023

(54) DISPLAY PANEL AND DISPLAY DEVICE

(71) Applicant: LG DISPLAY CO., LTD., Seoul (KR)

(72) Inventors: SeongHun Jeong, Paju-si (KR); Haye Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/555,798

(22) Filed: Dec. 20, 2021

(65) Prior Publication Data

US 2022/0208869 A1 Jun. 30, 2022

(30) Foreign Application Priority Data

Dec. 30, 2020 (KR) ........................ 10-2020-0188148

(51) Int. Cl.
| | |
|---|---|
| *H10K 59/121* | (2023.01) |
| *G06F 3/041* | (2006.01) |
| *G06F 3/044* | (2006.01) |
| *H10K 50/844* | (2023.01) |
| *H10K 59/40* | (2023.01) |
| *H10K 59/65* | (2023.01) |
| *H10K 59/122* | (2023.01) |
| *H10K 59/124* | (2023.01) |
| *H10K 59/131* | (2023.01) |

(52) U.S. Cl.
CPC ......... *H10K 59/121* (2023.02); *G06F 3/0412* (2013.01); *G06F 3/0446* (2019.05); *H10K 50/844* (2023.02); *H10K 59/122* (2023.02); *H10K 59/124* (2023.02); *H10K 59/131* (2023.02); *H10K 59/40* (2023.02); *H10K 59/65* (2023.02); *G06F 2203/04111* (2013.01)

(58) Field of Classification Search
CPC . H01L 27/326; H01L 27/3258; H01L 27/323; H01L 27/3234; H01L 27/3276; H01L 27/3246; H01L 51/5253; G06F 3/0446; G06F 3/04164; G06F 3/0412; G06F 3/0443; G06F 2203/04112; G06F 2203/04111; G09G 3/3225; H10K 59/121; H10K 59/131; H10K 59/40; H10K 59/65; H10K 59/122; H10K 59/124
USPC .................................................. 345/174, 76
See application file for complete search history.

(56) References Cited

U.S. PATENT DOCUMENTS

| | | | |
|---|---|---|---|
| 2017/0294502 A1* | 10/2017 | Ka ..................... | H01L 27/3276 |
| 2019/0214595 A1* | 7/2019 | Park .................... | H01L 27/3234 |
| 2021/0032156 A1* | 2/2021 | Hwang ............... | H01L 51/5237 |

(Continued)

*Primary Examiner* — Jimmy H Nguyen
(74) *Attorney, Agent, or Firm* — POLSINELLI PC

(57) ABSTRACT

A display panel includes an active area having a pixel area, a wiring area and a transmission area; a transistor layer located on the substrate and including a first display wiring and a second display wiring; a planarization layer located on the transistor layer; a light-emitting device layer located on the planarization layer and including a plurality of light-emitting devices; a first encapsulation layer located on the light-emitting device layer and including a first insulating film; and a touch sensor layer located on the first encapsulation layer and including a third display wiring and a fourth display wiring, wherein the first insulating film does not overlap with the transmission area, wherein the third display wiring is in contact with the first display wiring through a first contact hole, and wherein the fourth display wiring is in contact with the second display wiring through a second contact hole.

19 Claims, 14 Drawing Sheets

(56) References Cited

U.S. PATENT DOCUMENTS

2021/0104705 A1\* 4/2021 Kim .................. H01L 51/524
2021/0216157 A1\* 7/2021 Jeong ................ G06F 3/0446
2021/0359266 A1\* 11/2021 Bang ................. H01L 27/3225

\* cited by examiner

DISPLAY PANEL AND DISPLAY DEVICE

CROSS-REFERENCE TO RELATED APPLICATION

This application claims the priority of Korean Patent Application No. 10-2020-0188148, filed on Dec. 30, 2020, which is hereby incorporated by reference in its entirety for all purposes as if fully set forth herein.

BACKGROUND

Field of the Disclosure

The present disclosure relates to a display panel and a display device.

Description of the Background

Technological advances allow display devices to include a light-receiving device, such as a camera. In a display device, a light-receiving device may be located on the front surface of the display device on which images are displayed so as to be used for video calls or the like.

To dispose the light-receiving device on the front surface of the display device, the light-receiving device may be located in a non-active area around an active area of the display device. However, size of the non-active area located on the front surface of the display device needs to decreased, due to aesthetic considerations and in a practical aspect. However, it is difficult to dispose the light-receiving device in the non-active area.

In order to resolve the above-described problem, the light-receiving device may be disposed in the active area of the display device. However, since pixels and wires for driving the pixels are located in the active area, it is difficult for a sufficient quantity of light to be incident to the light-receiving device.

SUMMARY

Accordingly, the present disclosure is to provide a display panel and a display device including a first insulating film located to not overlap with a transmission area, such that the transmittance of the transmission area can be improved.

The present disclosure is also to provide a display panel and a display device including a touch sensor layer including a third display wiring and a fourth display wiring, wherein size of the wiring area is reduced, thereby improving transmittance.

According to an aspect of the present disclosure, a display panel includes a substrate, a transistor layer located on the substrate, a planarization layer located on the transistor layer, a light-emitting device layer located on the planarization layer, a first encapsulation layer located on the light-emitting device layer, and a touch sensor layer located on the first encapsulation layer.

The substrate may include a plurality of subpixels. The substrate may also include a first active area and a second active area. The number of subpixels per unit area in the first active area is smaller than the number of subpixels per unit area in the second active area.

The first active area includes a pixel area, a wiring area, and a transmission area.

The transistor layer includes first display wiring and second display wiring.

The light-emitting device layer includes a plurality of light-emitting devices.

The first encapsulation layer includes a first insulating film. The first insulating film is located to not overlap with the transmission area.

The touch sensor layer includes third display wiring and fourth display wiring.

The third display wiring may be in contact with the first display wiring through a contact hole.

The fourth display wiring may be in contact with the second display wiring through a contact hole.

The touch sensor layer may include first touch wiring and second touch wiring.

The third display wiring may be made from the same material as the first touch wiring.

The fourth display wiring may be made from the same material as the second touch wiring.

The first touch wiring and the second touch wiring may be located in different layers. The second touch wiring may be a bridge pattern electrically connecting the first touch wiring.

The first insulating film may be an organic layer planarizing the light-emitting device layer.

The display panel may further include a second encapsulation layer located on the touch sensor layer.

The display panel may include a second insulating film. The second insulating film may be an organic layer planarizing the third display wiring and the display wiring. The second insulating film may be located to not overlap with the transmission area.

The planarization layer may be an organic layer planarizing the transistor layer. The planarization layer may be located to not overlap with the transmission area.

The light-emitting device layer may include a common electrode. The common electrode may be located to not overlap with the transmission area.

The light-emitting device layer may include a bank layer including dams. The dams may be located on peripheral portions of the first insulating film in the pixel area.

The light-emitting devices, the first display wiring, and the second display wiring may be located in the pixel area.

None of the light-emitting devices may be located in the wiring area, and the first display wiring, the second display wiring, the third display wiring, and the fourth display wiring are located in the wiring area.

None of the light-emitting devices, the first display wiring, the second display wiring, the third display wiring, and the fourth display wiring may be located in the transmission area.

According to an aspect, aspects of the present disclosure may provide a display device including a display panel and a control circuit.

According to aspects of the present disclosure, each of the display panel and the display device includes the first insulating film located to not overlap with a transmission area, such that the transmittance of the transmission area is improved.

According to aspects of the present disclosure, each of the display panel and the display device includes the touch sensor layer including the third display wiring and the fourth display wiring, wherein the size of the wiring area is reduced, thereby improving transmittance.

BRIEF DESCRIPTION OF THE DRAWINGS

The above and other features and advantages of the present disclosure will be more clearly understood from the following detailed description, taken in conjunction with the accompanying drawings, in which.

DETAILED DESCRIPTION

Figure 1:
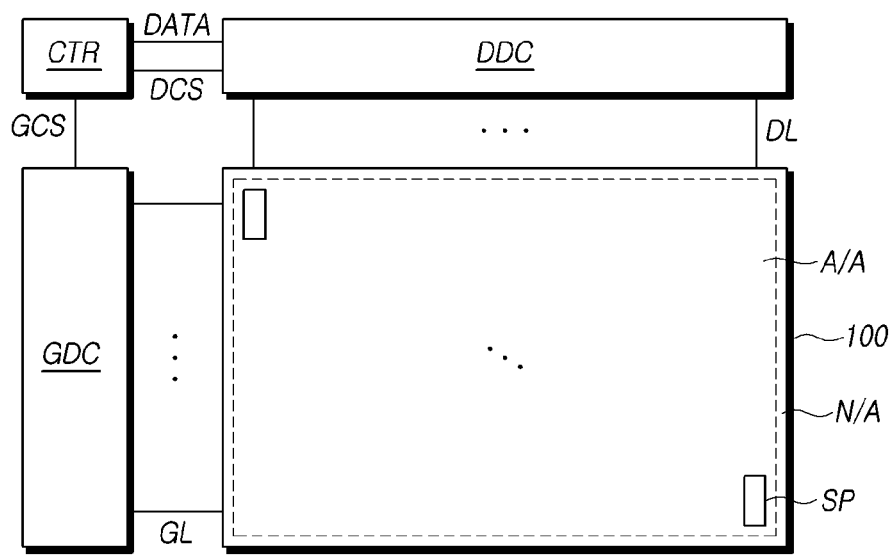
FIGS. 1 and 2 are diagrams illustrating a system configuration of a display device according to the present disclosure.

In the following description of examples or aspects of the present disclosure, reference will be made to the accompanying drawings in which it is shown by way of illustration specific examples or aspects that can be implemented, and in which the same reference numerals and signs can be used to designate the same or like components even when they are shown in different accompanying drawings from one another. Further, in the following description of examples or aspects of the present disclosure, detailed descriptions of well-known functions and components incorporated herein will be omitted when it is determined that the description may make the subject matter in some aspects of the present disclosure rather unclear. The terms such as "including", "having", "containing", "constituting", "made up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present disclosure. Each of these terms is not used to define essence, order, sequence, or number of elements, etc., but is used merely to distinguish the corresponding element from other elements.

When it is mentioned that a first element "is connected or coupled to", "contacts or overlap withs", etc. a second element, it should be interpreted that, not only can the first element "be directly connected or coupled to" or "directly contact or overlap with" the second element, but a third element can also be "interposed" between the first and second elements, or the first and second elements can "be connected or coupled to", "contact or overlap with", etc. each other via a fourth element. Here, the second element may be included in at least one of two or more elements that "are connected or coupled to", "contact or overlap with", etc. each other.

When time relative terms, such as "after", "subsequent to", "next", "before", and the like, are used to describe processes or operations of elements or configurations, or flows or steps in operating, processing, manufacturing methods, these terms may be used to describe non-consecutive or non-sequential processes or operations unless the term "directly" or "immediately" is used together therewith.

In addition, when any dimensions, relative sizes, etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

FIG. 1 is a structural diagram illustrating a display device 10 according to the present disclosure.

Referring to FIG. 1, the display device 10 according to the present disclosure includes a display panel 100 including an active area (or a display area) A/A and a non-active area (or a non-display area) N/A and control circuits for driving the display panel 100 such as a gate driver circuit GDC, a data driver circuit DDC, and a controller CTR.

In the display panel 100, a plurality of gate lines GL and a plurality of data lines DL are provided, and a plurality of subpixels 111 are disposed in areas in which the gate lines GL intersect the data lines DL. In addition, the display panel 100 may be a liquid crystal panel. The liquid crystal panel may include pixel electrodes, a common electrode, and a liquid crystal layer disposed between the pixel electrodes and the common electrode. The liquid crystal layer may display an image using liquid crystals that can block light or allow light to pass therethrough by changing molecular alignments thereof in response to voltages applied to the pixel electrodes and the common electrode.

The gate driver circuit GDC is controlled by the controller CTR. The gate driver circuit GDC may control the driving timing of the plurality of subpixels 111 by sequentially outputting scan signals to the plurality of gate lines GL disposed in the display panel 100.

The data driver circuit DDC may receive image data from the controller CTR and convert the image data into an analog data voltage. The data driver circuit DDC may output the analog data voltage to the data lines DL at points in time at which a scan signal is applied through the gate lines GL, so that each of the subpixels 111 may express brightness according to the image data.

The controller CTR may control the operation of the gate driver circuit GDC and the data driver circuit DDC by supplying a variety of control signals to the gate driver circuit GDC and the data driver circuit DDC.

The display device 10 may further include a power management integrated circuit (IC) supplying a variety of voltages or currents to the display panel 100, the gate driver circuit GDC, the data driver circuit DDC, and the like or controlling a variety of voltages or currents to be supplied.

The display device 10 according to aspects of the present disclosure may be an organic light-emitting display device, an LCD device, a plasma display device, or the like.

When the display device 10 according to aspects is an organic light-emitting display device, each of the subpixels 111 arranged in the display panel 100 may include an organic light-emitting diode (OLED) serving as a self-luminous device and circuit components, such as a driver transistor, for driving the OLED.

The type and number of the circuit components of each of the subpixels 111 may be determined variously depending on functions that can be provided, design, or the like.

Figure 2:
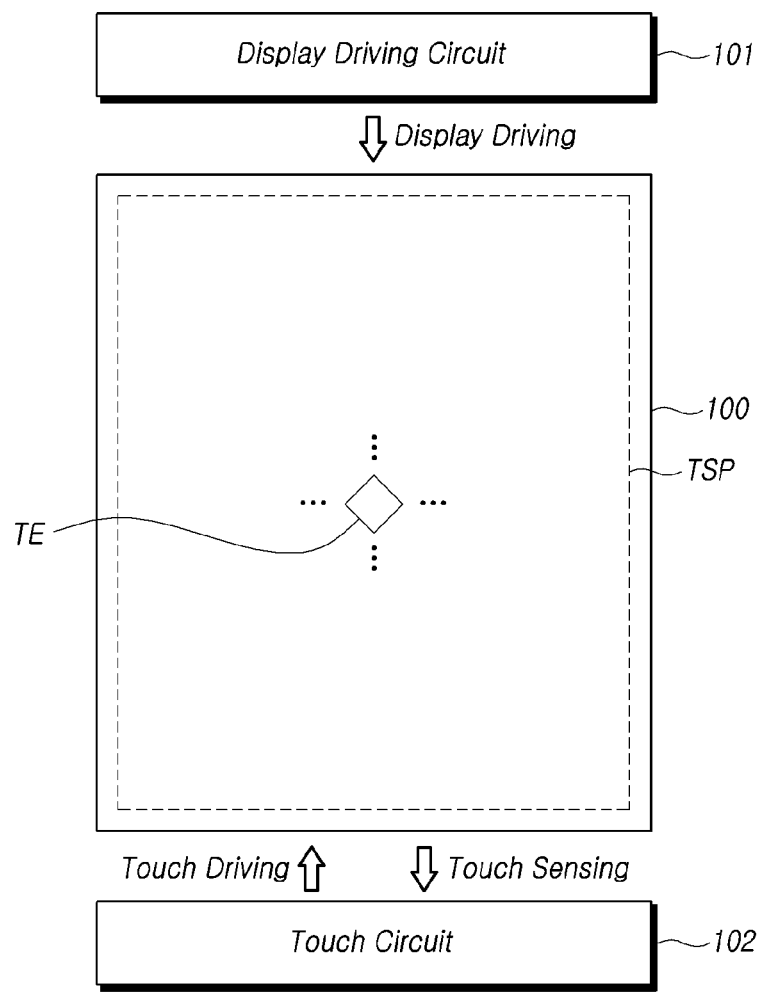

FIG. 2 is a diagram illustrating a system configuration of the display device 10 according to the present disclosure.

Referring to FIG. 2, the display device 10 may provide an image display function of displaying images and a touch sensing function of detecting user touches.

The display device 10 may include the display panel 100 provided with the data lines and the gate lines and a display driving circuit 101 and the like for driving the display panel 100 in order to display images.

The display driving circuit 101 may include a data driver circuit for driving the data lines, a gate driver circuit for driving the gate lines, a controller for controlling the data driver circuit and the gate driver circuit, and the like, from a function point of view.

The display driving circuit 101 may be implemented as one or more integrated circuits (ICs).

For the touch sensing, the display device 10 may include a touchscreen panel TSP, a touch circuit 102, and the like. The touchscreen panel TSP is provided with a plurality of touch electrodes TE and a plurality of touch lines TL electrically connected to the entirety or some of the plurality of touch electrodes TE. The touch circuit 102 detects a touch or a touch position by driving the touchscreen panel TSP.

The touch circuit 102 supplies a touch driving signal to the touchscreen panel TSP, detects a touch sensing signal from the touchscreen panel TSP, and detects at least one of the touch and the touch position (i.e., touch coordinates) on the basis of the touch sensing signal in order to drive the touchscreen panel TSP.

The touch circuit 102 may include a touch driving circuit for supplying the touch driving signal and receiving the touch sensing signal, a touch controller for determining at least one of the touch and the touch position (i.e., touch coordinates) by calculation, and the like.

The touch circuit 102 may be implemented as one or more components (e.g., ICs), and may be provided separately from the display driving circuit 101.

In addition, the entirety or a portion of the touch circuit 102 may be integrated with the display driving circuit 101 or an internal circuit of the display driving circuit 101. For example, the touch driving circuit of the touch circuit 102 may be provided as an IC together with a data driver circuit of the display driving circuit 101.

In addition, the display device 10 according to aspects may detect a touch on the basis of capacitance formed on the touch electrodes TE.

In the touch electrodes TE, some of driving touch electrodes disposed in the same row (or the same column) are electrically connected to each other, thereby forming a single driving touch electrode (TE) line.

In the touch electrodes TE, some of sensing touch electrodes disposed in the same column (or the same row) are electrically connected to each other, thereby forming a single sensing touch electrode line.

In addition, the display panel 100 of the display device 10 according to aspects may be implemented as a variety of panels, such as an OLED panel and a liquid crystal display (LCD) panel. Hereinafter, the display panel 100 will mainly be described as being an OLED panel for convenience of description.

Figure 3:
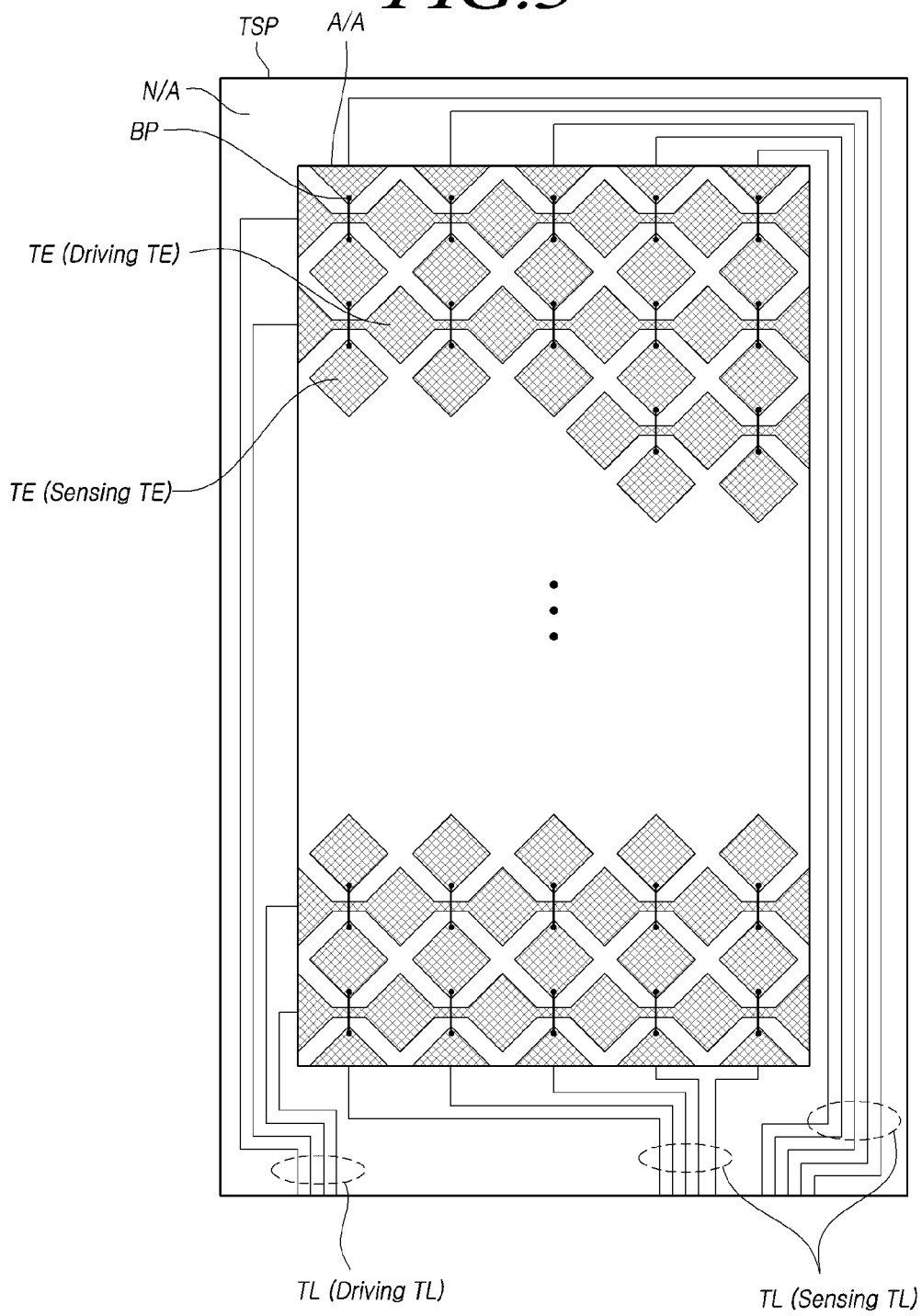
FIG. 3 is a diagram illustrating a touchscreen panel according to the present disclosure.

FIG. 3 is a diagram illustrating the touchscreen panel TSP according to the present disclosure.

Referring to FIG. 3, the plurality of touch electrodes TE are disposed on the touchscreen panel TSP. The touch lines TL electrically connecting the touch electrodes TE to the touch circuit may also be disposed on the touchscreen panel TSP.

The touch lines TL may be electrically connected to touch electrodes TE disposed on the outermost portions, among the plurality of touch electrodes TE. Hereinafter, the touch electrodes TE disposed on the outermost portions will also be referred to as outermost touch electrodes O-TE.

In addition, in the touchscreen panel TSP, touch pads in contact with the touch circuit may be provided to electrically connect the touch lines TL to the touch circuit.

The touch electrodes TE and the touch lines TL may be present on the same layer or different layers.

Two or more touch electrodes TE forming a single driving TE line are electrically connected to each other. Here, the two or more touch electrodes TE may be integrated with each other to be electrically connected to each other or may be electrically connected to each other by a bridge.

The two or more touch electrodes TE forming a single sensing TE line are electrically connected to each other. Here, the two or more touch electrodes TE may be integrated with each other to be electrically connected to each other or may be electrically connected to each other by a bridge.

In the illustration of FIG. 3, the two or more touch electrodes TE forming a single driving TE line are integrated with and electrically connected to each other, whereas the two or more touch electrodes TE forming a single sensing TE line are integrated to each other by a bridge BP.

Here, the two or more touch electrodes TE forming a single driving TE line are also referred to as the driving touch electrodes TE, whereas the two or more touch electrodes forming a single TE line are also referred to as the sensing touch electrodes TE.

Every driving TE line may be connected to at least one touch line TL, whereas every sensing TE line may be connected to at least one touch line TL.

The at least one touch line TL, to which every driving TE line is connected, is also referred to as the driving touch line TL, whereas the at least one touch line TL, to which every sensing TE line is connected, is also referred to as the sensing touch line TL.

A single touch pad TP may be connected to every touch line TL.

Still referring to FIG. 3, each of the plurality of touch electrodes TE may have, for example, a rhomboid outline or, in some cases, a rectangular outline (including a quadrangular outline). In addition, each of the plurality of touch electrodes TE may have a variety of other shapes.

Considering the display performance and the touch performance of the display device 10, the touch electrodes TE may be designed into a variety of shapes.

Although the touchscreen panel TSP illustrated in FIG. 3 extends in the column direction, the touchscreen panel TSP may be designed to extend in the row direction depending on the type (e.g., TV, monitor, or mobile terminal) or design of the display device 10.

Although the touchscreen panel TSP according to aspects may be present outside the display panel 100 (in the case of an add-on touchscreen panel) or may be present inside the display panel 100 (in the case of an in-cell touchscreen panel).

When the touchscreen panel TSP is an add-on touchscreen panel, the touchscreen panel TSP and the display panel 100 may be separately fabricated by different panel fabrication processes and then combined with each other.

When the touchscreen panel TSP is an in-cell touchscreen panel, the touchscreen panel TSP and the display panel 100 may be fabricated together by a single panel fabrication process.

When the touchscreen panel TSP is an in-cell touchscreen panel, the touchscreen panel TSP may be regarded as an assembly of the plurality of touch electrodes TE. Here, a plate on which the plurality of touch electrodes TE are disposed may be a dedicated substrate or a layer (e.g., an encapsulation layer) already present in the display panel 100.

The plurality of touch electrodes TE and the plurality of touch lines TL may be provided in the touchscreen panel TSP.

The plurality of touch electrodes TE may be located in an area corresponding to the active area A/A of the display panel 100.

The plurality of touch lines TL may be located in an area corresponding to the non-active area N/A of the display panel 100.

That is, the plurality of touch lines TL are present outside the touch electrode area (i.e., the active area A/A) in which the plurality of touch electrodes TE are disposed.

The touchscreen panel TSP may be disposed internally or externally of the display panel 100.

As described above, by disposing the touch electrodes TE in the active area A/A of the display panel 100 and the touch lines TL in the non-active area N/A of the display panel 100, the touch sensing matching the screen display status may be provided.

Referring to FIG. 3, each of the plurality of touch lines TL is electrically connected to the touch circuit.

Each of the driving touch lines TL among the plurality of touch lines TL is electrically connected at one end to a corresponding driving channel of the touch circuit and is electrically connected at the other end to the outermost touch electrodes among the touch electrodes TE included in the corresponding driving TE line.

Each of the sensing touch lines TL among the plurality of touch lines TL is electrically connected at one end to a corresponding sensing channel of the touch circuit and is electrically connected to the outermost touch electrodes among the touch electrodes TE included in the corresponding sensing TE line.

Figure 4:
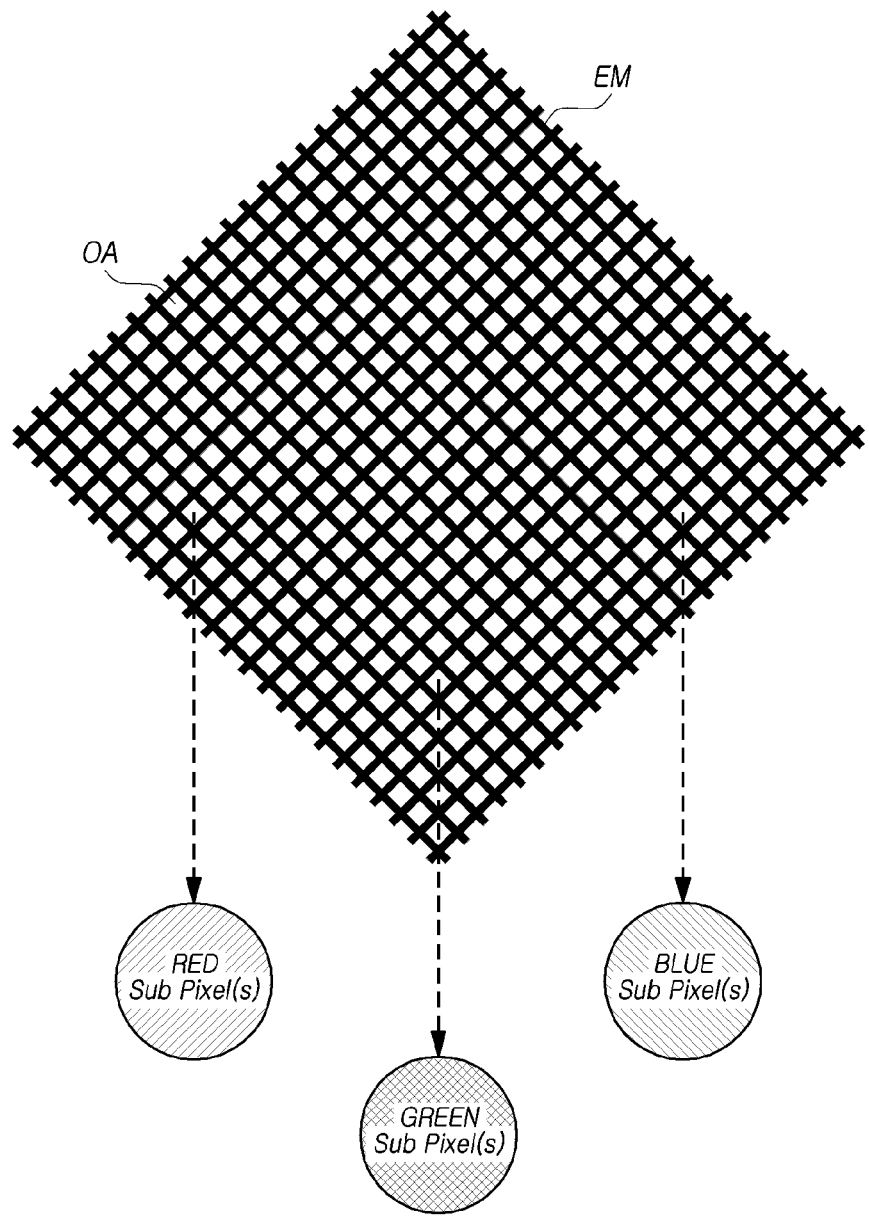
FIG. 4 is a diagram illustrating a touch electrode of the display panel according to the present disclosure.

FIG. 4 is a diagram illustrating the touch electrode of the display panel according to the present disclosure.

FIG. 4 illustrates the correspondence between an area of a mesh-type touch electrode TE and a subpixel area in the display device 10 according to aspects.

Referring to FIG. 4, in the display device 10 according to aspects, each of the plurality of touch electrodes TE may be a mesh-type electrode metal EM patterned into the shape of a network (or a mesh), with open areas OA being present. Here, the open areas OA are also referred to as openings.

In the touch electrode TE in which the electrode metal ET is patterned in the shape of a mesh, each of the open areas OA may correspond to an emissive portion of at least one subpixel.

For example, when the display panel 100 is an LCD panel, the emissive portion of the subpixel may include a pixel electrode, a color filter, or the like. When the display panel 100 is an OLED panel, the emissive portion of the subpixel may include an anode, an organic emissive layer, or the like of an OLED and, in some cases, a color filter and the like.

As described above, the electrode metal EM of the touch electrode TE may be patterned such that the emissive portion of the at least one subpixel is present in a position corresponding to each of the open areas OA present in the area of the touch electrode TE when seen in a plan view. Thus, even in the case that the electrode metal EM is made from an opaque material, the luminous efficiency of the display panel 100 may be improved.

Figure 5:
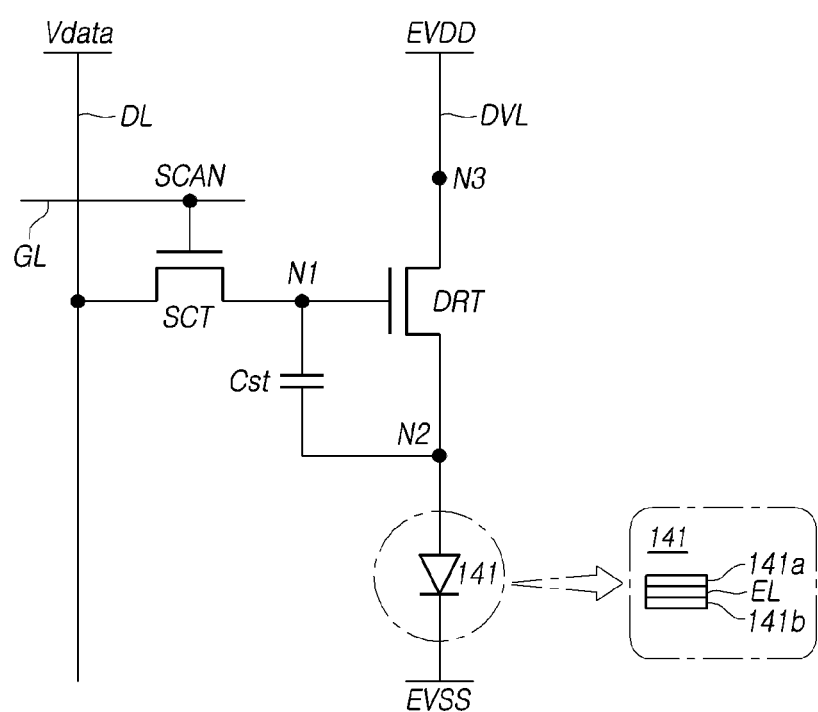
FIG. 5 is a circuit diagram illustrating a subpixel of the display device according to the present disclosure.

FIG. 5 is a diagram illustrating an equivalent circuit of the subpixel 111 of the display device 10 according to the present disclosure.

Referring to FIG. 5, each of the plurality of subpixels 111 of the display device 10 according to aspects of the present disclosure may include a light-emitting device 141, a driver transistor DRT, a scan transistor SCT, a storage capacitor Cst, and the like.

The light-emitting device 141 may include a pixel electrode 141a, a common electrode 141b, and an emissive layer EL located between the pixel electrode 141a and the common electrode 141b. Here, the pixel electrode 141a may be provided in each of the subpixels 111, and the common electrode 141b may be commonly provided in the subpixels 111. In an example, the pixel electrode 141a may be an anode, whereas the common electrode 141b may be a cathode. In another example, the pixel electrode 141a may be a cathode, whereas the common electrode 141b may be an anode. For example, the light-emitting device 141 may be an organic light-emitting diode (OLED), a micro light-emitting diode (LED), a quantum dot light-emitting diode (QD-LED), or the like.

The driver transistor DRT is a transistor for driving the light-emitting device 141, and may include a first node N1, a second node N2, a third node N3, and the like.

The first node N1 of the driver transistor DRT may be a gate node of the driver transistor DRT, and may be electrically connected to a source node or a drain node of the scan transistor SCT. The second node N2 of the driver transistor DRT may be a source node or a drain node of the driver transistor DRT, and may be electrically connected to the pixel electrode 141a of the light-emitting device 141. The third node N3 of the driver transistor DRT may be electrically connected to a drive voltage line DVL through which a driving voltage EVDD is supplied.

The scan transistor SCT may be controlled by a scan signal SCAN, and may be connected to the first node N1 of the transistor DRT and to a data line DL. The scan transistor SCT may be turned on or off by the scan signal SCAN supplied through a gate line GL to control the connection between the data line DL and the first node N1 of the driver transistor DRT.

The scan transistor SCT may be turned on by the scan signal SCAN having a turn-on-level voltage to transfer a data voltage Vdata, supplied through the data line DL, to the first node N1 of the driver transistor DRT.

Each of the driver transistor DRT and the scan transistor SCT may be an n-type transistor or a p-type transistor.

The storage capacitor Cst may be connected to the first node N1 of the driver transistor DRT and to the second node N2. The storage capacitor Cst is charged with an amount of electric charge corresponding to the difference in the voltage between both ends, and serves to hold the voltage difference between both ends during a predetermined frame time. Consequently, the corresponding subpixel 111 may emit light during the predetermined frame time.

The storage capacitor Cst may be an external capacitor intentionally designed to be provided externally of the driver transistor DRT, rather than being a parasitic capacitor (e.g. Cgs or Cgd), i.e., an internal capacitor present between the gate node and the source node (or the drain node) of the driver transistor DRT.

The subpixel 111 of the display device 10 according to aspects of the present disclosure may further include at least one transistor or at least one capacitor.

Figure 6:
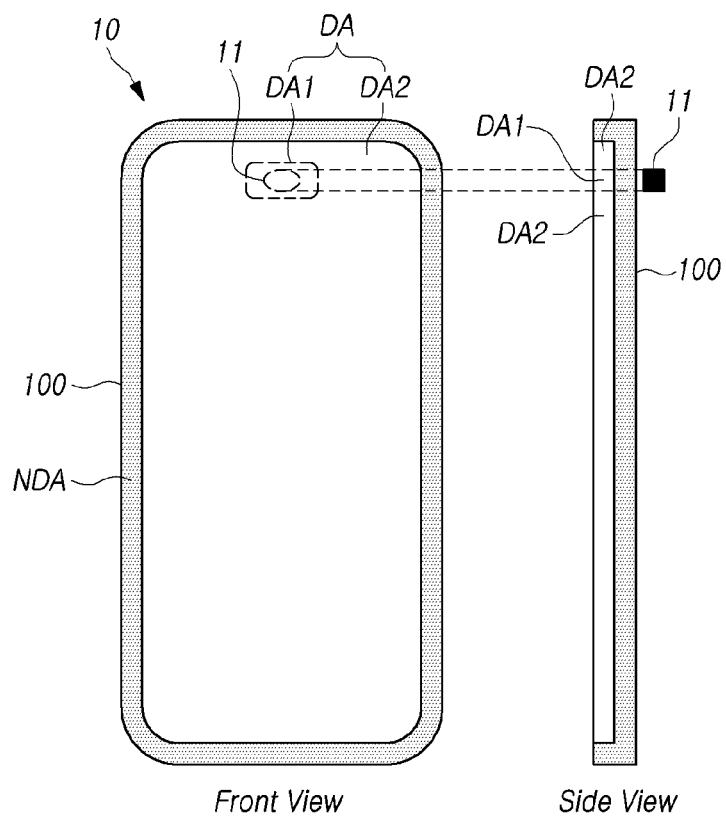
FIG. 6 is a schematic diagram illustrating the display device according to the present disclosure.

FIG. 6 is a schematic diagram illustrating the display device 10 according to the present disclosure.

Referring to FIG. 6, the display device 10 according to the present disclosure may include the display panel 100 for displaying images and a light-receiving device 11 for receiving light.

The display panel 100 may include a substrate, as well a plurality of insulating films, a transistor layer, and a light-emitting device layer disposed on the substrate.

The display panel 100 may include a plurality of subpixels for displaying images and a variety of signal lines for driving the plurality of subpixels. The variety of signal lines may include a plurality of data lines, a plurality of gate lines, a plurality of power lines, and the like. Here, each of the plurality of subpixels may include a transistor located in the transistor layer and a light-emitting device located in the light-emitting device layer.

The display panel 100 may include an active area (or a display area) DA on which images are displayed and a non-active area (or a non-display area) NDA disposed outside the active area DA. The plurality of subpixels may be disposed in the active area DA. A variety of signal lines may be disposed in and driver circuits may be connected to the non-active area NDA. The non-active area NDA may be bent so as to be invisible from front or may be concealed by a housing (not shown), and may also be referred to as a bezel.

Referring to FIG. 6, the active area DA may include a first active area DA1 and a second active area DA2.

The light-receiving device 11 is a device performing a predetermined function by receiving light. For example, the light-receiving device 11 may include at least one of a camera and a proximity sensor.

Although the light-receiving device 11 for receiving light, the light-receiving device 11 may be located behind (or below) the display panel 100. That is, the light-receiving device 11 may be located on a surface of the display panel 100 opposite the viewer-facing surface. The light-receiving device 11 is not exposed on the front surface of the display device 10. Thus, when a user sees the front surface of the display device 10, the light-receiving device 11 is invisible.

The camera located behind (or below) the display panel 100 is a front camera for capturing images in front of the display panel 100, and can see the view through a camera lens.

Referring to FIG. 6, the light-receiving device 11 may be disposed to overlap with the active area DA of the display panel 100. That is, the light-receiving device 11 may be located in the active area DA.

A portion of the active area DA overlapping with the light-receiving device 11 is referred to as the first active area DA1 and the remaining portion of the active area DA is referred to as the second active area DA2. Consequently, the light-receiving device 11 may be located to overlap with the first active area DA1 in the active area DA. In other words, the light-receiving device 11 may be regarded as being located in the first active area DA1 in the active area DA.

Since the first active area DA1 in the active area DA is an area overlapping with the light-receiving device 11, the transmittance of the first active area DA1 in the active area DA is required to be superior to the transmittance of the second active area DA2 not overlapping with the light-receiving device 11.

To improve the transmittance of the first active area DA1 overlapping with the light-receiving device 11, the resolution, the subpixel arrangement structure, the number of subpixels per unit area, the electrode structure, the structure of wires (or conductive lines), the arrangement structure of the electrodes, the arrangement structure of the wires, and the like of the first active area DA1 may be different from those of the second active area DA2.

For example, the number of the subpixels per unit area in the first active area DA1 may be smaller than the number of the subpixels per unit area in the second active area DA2. Thus, the resolution of the first active area DA1 may be lower than that of the second active area DA2.

In the display device 10 according to aspects of the present disclosure, the light-receiving device 11 is a camera located below the display panel 100 and not exposed to the outside, which is also referred to as an under display camera (UDC).

The display device 10 according to aspects of the present disclosure may have a smaller bezel, and it is not necessary to fabricate the display panel 100 having a notch. In addition, since design constraints caused by the light-receiving device 11 are removed, the freedom of design of the display device may be improved.

In the display device 10 according to aspects of the present disclosure, although the light-receiving device 11 is located behind the display panel 100, the light-receiving device 11 must be able to ordinarily perform a predetermined function by ordinarily receiving light. In addition, in the display device 10 according to aspects of the present disclosure, although the light-receiving device 11 is located behind the display panel 100 while overlapping with the active area DA, the light-receiving device 11 must be able to ordinarily perform a predetermined function by ordinarily receiving light, and the display device 10 must be able to ordinarily display images on the active area DA.

In this regard, the display device 10 according to aspects of the present disclosure proposes a structure able to improve the transmittance of the first active area DA1 overlapping with the light-receiving device 11.

Figure 7:
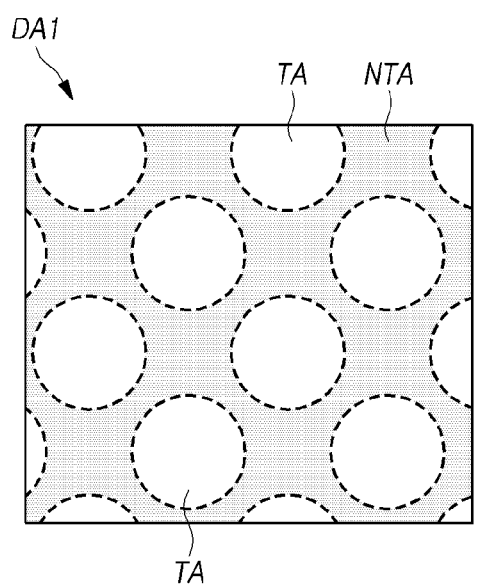
FIG. 7 is a diagram illustrating a transmission area and a non-transmission area of the display panel according to the present disclosure.
Figure 8:
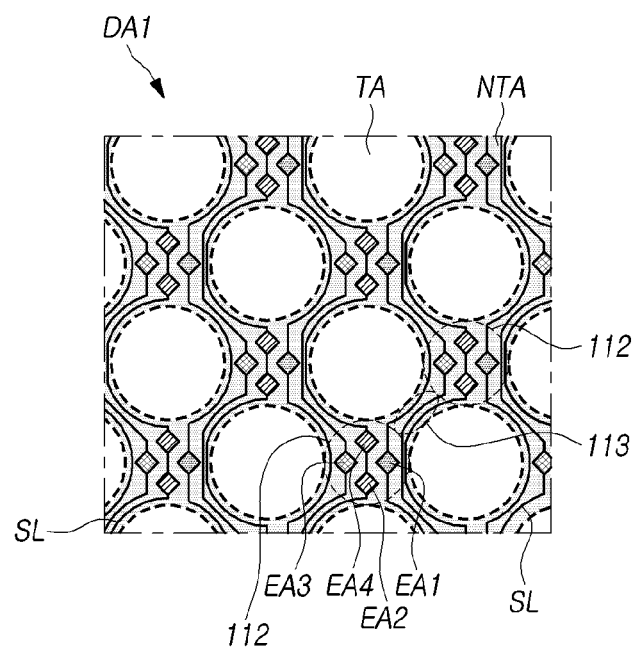
FIG. 8 is a diagram illustrating the transmission area, the pixel area, and the wiring area of the display panel according to the present disclosure.

Referring to FIGS. 7 and 8, the first active area DA1 is an area overlapping with the light-receiving device 11. The light-receiving device 11 may include a non-transmission area NTA and a transmission area TA.

Referring to FIGS. 7 and 8, the transmission area TA may be an area included in the first active area DA1, and may be an area allowing external light to pass therethrough to be incident to the light-receiving device 11. For example, the transmission area TA may have a circular shape or an elliptical shape, and may also be referred to as a hole area.

Referring to FIGS. 7 and 8, the non-transmission area NTA may be an area included in the first active area DA1, and may be an area in which transistors of the transistor layer and light-emitting devices of the light-emitting device layer are located.

Referring to FIGS. 7 and 8, the non-transmission area NTA may include a pixel area 112 in which emissive areas EA1, EA2, EA3, and EA4 of the subpixels are present and a wiring area 113 in which signal lines SL are disposed.

Referring to FIGS. 7 and 8, when the transmission area TA is surrounded by the non-transmission area NTA, the first active area DA1 may include a plurality of transmission areas TA separated from each other.

Figure 9:
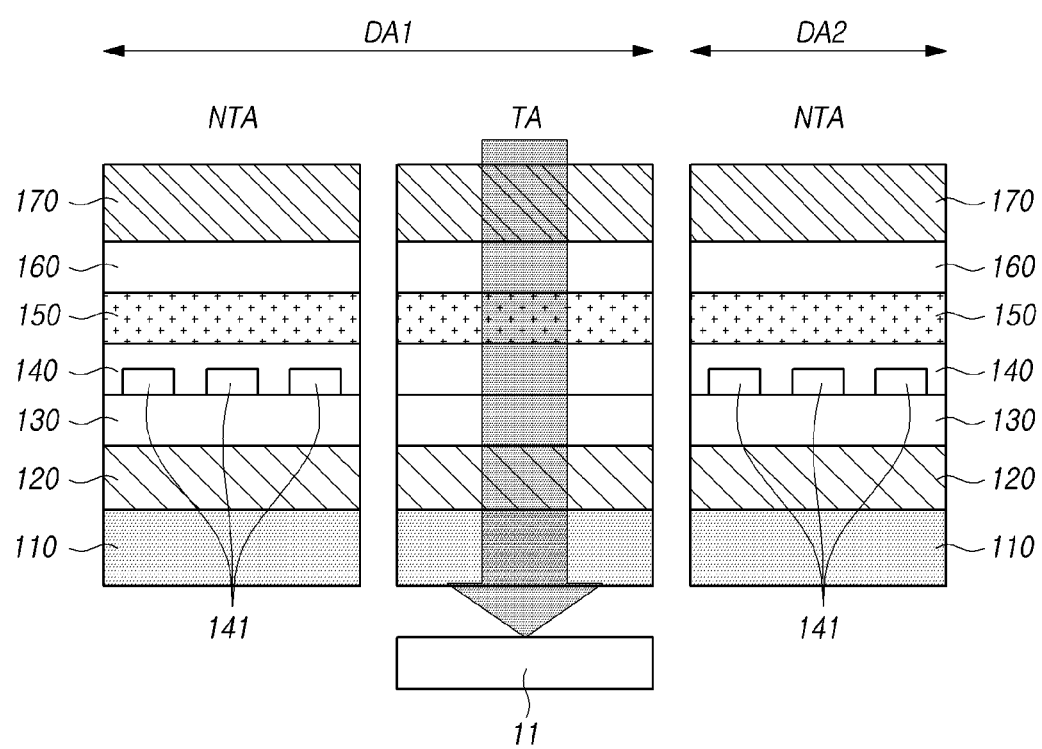
FIG. 9 is a schematic diagram illustrating a cross-section of the display panel according to the present disclosure.

FIG. 9 is a diagram illustrating the cross-sectional structure of the non-transmission area NTA of the first active area DA1, the cross-sectional structure of the transmission area TA of the first active area DA1, and the cross-sectional structure of the second active area DA2 in the display device 10 according to aspects of the present disclosure.

Referring to FIG. 9, the first active area DA1 of the display panel 100 may include the transmission area TA and the non-transmission area NTA. The second active area DA2 of the display panel 100 may be regarded as the non-transmission area NTA.

Referring to FIG. 9, the stacked structure of the non-transmission area NTA of the first active area DA1, the stacked structure of the transmission area TA of the first active area DA1, and the stacked structure of the second active area DA2 will be described.

Referring to FIG. 9, the stacked structure of the second active area DA2 will be described as follows.

In the second active area DA2, a transistor layer 120 may be disposed on a substrate 110, a planarization layer 130 may be disposed on the transistor layer 120, a light-emitting device layer 140 may be disposed on the planarization layer 130, a first encapsulation layer 150 may be disposed on the light-emitting device layer 140, a touch sensor layer 160 may be disposed on the first encapsulation layer 150, and a second encapsulation layer 170 may be disposed on the touch sensor layer 160.

In the second active area DA2, transistors, such as the driver transistor DRT and the scan transistor SCT, of each of the subpixels 111 may be disposed in the transistor layer 120. A variety of insulating films for forming the transistors may also be disposed in the transistor layer 120. Here, the variety of insulating films may include an organic film and an inorganic film.

In the second active area DA2, a variety of wires, such as the data lines DL, the gate lines GL, and the driving voltage lines DVL, may be disposed.

In the second active area DA2, the light-emitting device 141 of each of the subpixels 111 may be disposed in the light-emitting device layer 140. Thus, in the second active area DA2, the pixel electrode 141a, the emissive layer EL, and the common electrode 141b of the light-emitting device 141 may be disposed in the light-emitting device layer 140.

In the second active area DA2, touch sensors TS may be disposed in the touch sensor layer 160, and a touch buffer film, a touch insulating film, and the like necessary for the formation of the touch sensors TS may also be disposed in the touch sensor layer 160.

Referring to FIG. 9, the stacked structure of the non-transmission area NTA of the first active area DA1 is the same as the stacked structure of the second active area DA2.

In the non-transmission area NTA of the first active area DA1, the transistor layer 120 may be disposed on the substrate 110, the planarization layer 130 may be disposed on the transistor layer 120, the light-emitting device layer 140 may be disposed on the planarization layer 130, the first encapsulation layer 150 may be disposed on the light-emitting device layer 140, the touch sensor layer 160 may be disposed on the first encapsulation layer 150, and the second encapsulation layer 170 may be disposed on the touch sensor layer 160.

The light-emitting device 141 is vulnerable to moisture or oxygen. The first encapsulation layer 150 may prevent the infiltration of moisture or oxygen, thereby preventing the light-emitting device 141 from being exposed to moisture or oxygen. Although the first encapsulation layer 150 may be a single layer, the first encapsulation layer 150 may also be a multilayer.

In the non-transmission area NTA of the first active area DA1, transistors, such as the driver transistor DRT and the scan transistor SCT, may be disposed in the transistor layer 120, and a variety of insulating films for forming the transistors may also be disposed in the transistor layer 120. Here, the variety of insulating films may include an organic film and an inorganic film.

In the non-transmission area NTA of the first active area DA1, a variety of wires, such as the data lines DL, the gate lines GL, and the driving voltage lines DVL, may be disposed.

In the non-transmission area NTA of the first active area DA1, the light-emitting device 141 of each of the subpixels 111 may be disposed in the light-emitting device layer 140. Thus, in the second active area DA2, the pixel electrode 141a, the emissive layer EL, and the common electrode 141b of the light-emitting device 141 may be disposed in the light-emitting device layer 140.

In the non-transmission area NTA of the first active area DA1, the touch sensors TS may be disposed in the touch sensor layer 160, and the touch buffer film, the touch insulating film, and the like necessary for the formation of the touch sensors TS may also be disposed in the touch sensor layer 160.

Referring to FIG. 9, the stacked structure of the first active area DA1 will be described as follows.

Referring to FIG. 9, in the transmission area TA of the first active area DA1, the transistor layer 120 may be disposed on the substrate 110, the planarization layer 130 may be disposed on the transistor layer 120, the light-emitting device layer 140 may be disposed on the planarization layer 130, the first encapsulation layer 150 may be disposed on the light-emitting device layer 140, the touch sensor layer 160 may be disposed on the first encapsulation layer 150, and the second encapsulation layer 170 may be disposed on the touch sensor layer 160.

In the transmission area TA of the first active area DA1, transistors, such as the driver transistor DRT and the scan transistor SCT, and a variety of wires of each of the subpixels 111 may be disposed in the transistor layer 120, and the light-emitting device 141 of each of the subpixels 111 may be disposed in the light-emitting device layer 140. In the second active area DA2, the touch sensors TS may be disposed in the touch sensor layer 160.

In the transmission area TA of the first active area DA1, none of the transistors and the wires are disposed in transistor layer 120. However, in the transmission area TA of the first active area DA1, a variety of insulating films necessary for the formation of the transistors may be disposed in the transistor layer 120. Here, the variety of insulating films may include an organic film and an inorganic film.

In the transmission area TA of the first active area DA1, the light-emitting device 141 of each of the subpixels 111 is not disposed in the light-emitting device layer 140. Thus, in the transmission area TA of the first active area DA1, none of the pixel electrode 141a, the emissive layer EL, and the common electrode 141b are disposed in the light-emitting device layer 140. In some cases, in the transmission area TA of the first active area DA1, only some of the pixel electrode 141a, the emissive layer EL, and the common electrode 141b may be disposed in the light-emitting device layer 140. For example, in the transmission area TA of the first active area DA1, only the emissive layer EL may be disposed in the light-emitting device layer 140.

In the transmission area TA of the first active area DA1, the touch sensors TS are not disposed in the touch sensor layer 160. However, in the transmission area TA of the first active area DA1, the touch buffer film, the touch insulating film, and the like may be disposed in the touch sensor layer 160.

Referring to FIG. 9, among a metal layer and an insulator layer disposed in the non-transmission areas NTA of the first active area DA1 and the second active area DA2, the metal layer is not disposed in the transmission area TA of the first active area DA1. However, the insulator layer among the metal layer and the insulator layer disposed in the non-transmission areas NTA of the first active area DA1 and the second active area DA2 may extend to the transmission area TA of the first active area DA1.

In other words, the metal layer is disposed in the non-transmission area NTA of the first active area DA1 and the non-transmission area NTA of the second active area DA2 and is not disposed in the transmission area TA of the first active area DA1. The insulator layer may be commonly disposed in the non-transmission area NTA of the first active area DA1, the non-transmission area NTA of the second active area DA2, and the transmission area TA of the first active area DA1.

Referring to FIG. 9, the transmission area TA of the first active area DA1 in the display panel 100 may overlap with the light-receiving device 11.

External light is incident to the light-receiving device 11 through the transmission area TA of the first active area DA1. Thus, for normal operation of the light-receiving device 11, the transmittance of the transmission area TA of the first active area DA1 must be high.

Figure 10:
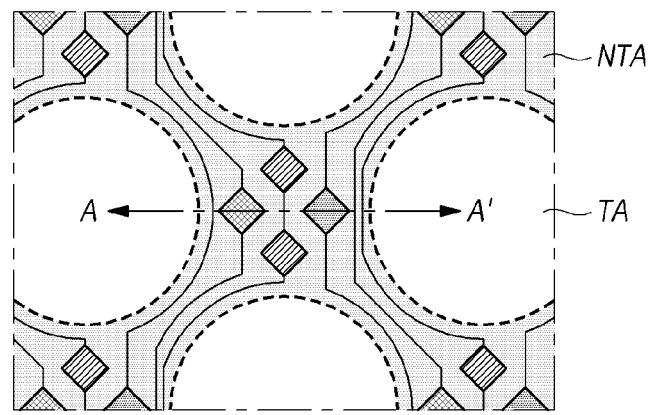
FIGS. 10 and 11 are plan and cross-sectional views illustrating the display panel according to a comparative aspect of the present disclosure.
Figure 10:
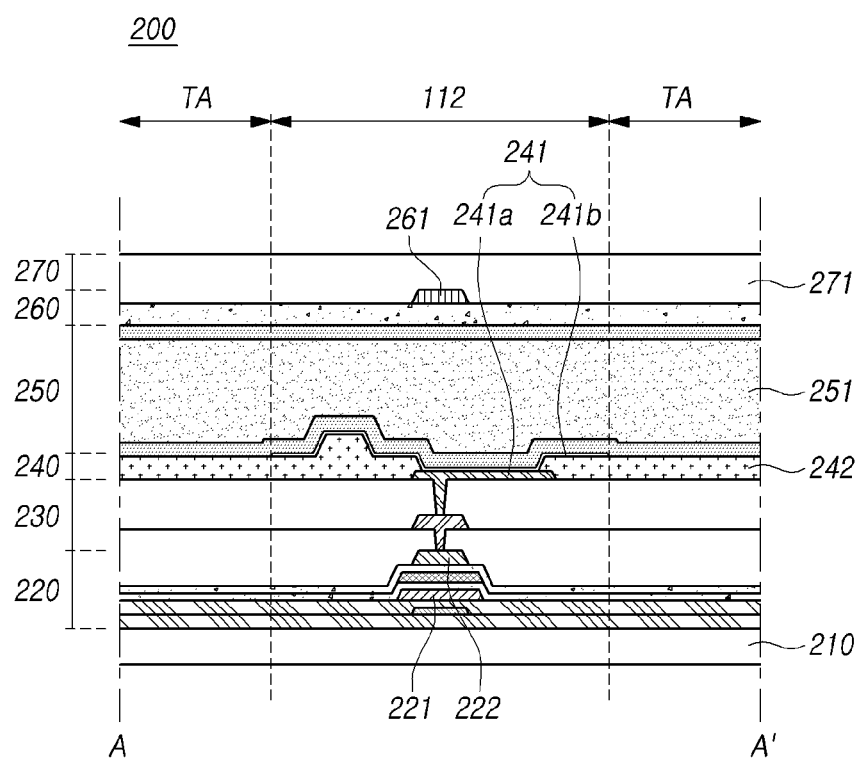
Figure 11:
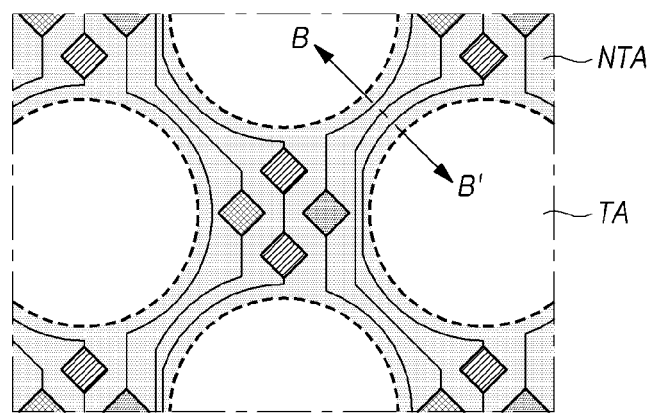
Figure 11:
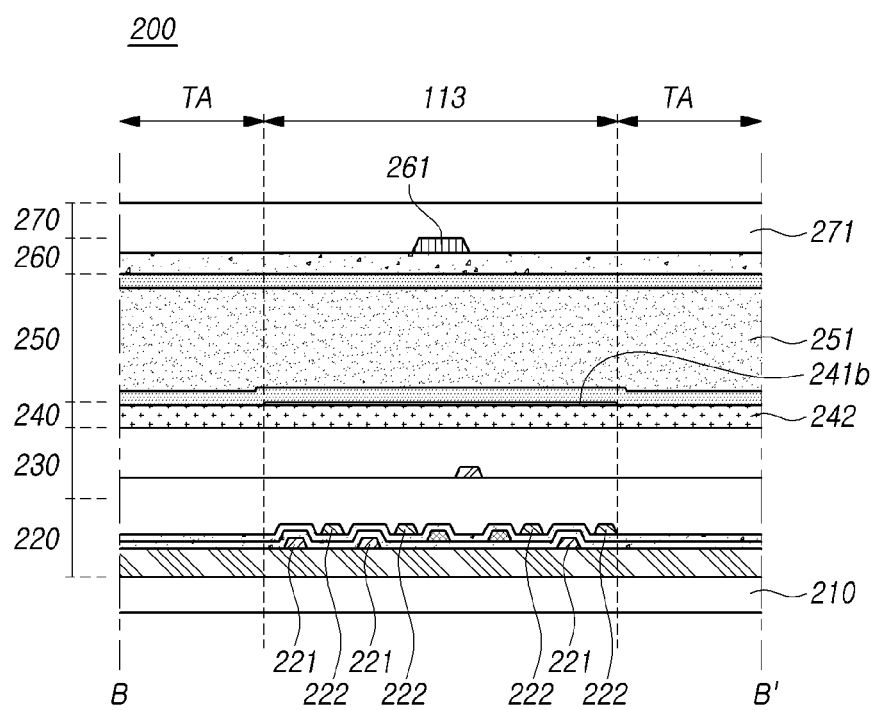

FIGS. 10 and 11 are plan and cross-sectional views illustrating a display panel according to a comparative aspect of the present disclosure.

The cross-sectional view of FIG. 10 is taken along line A-A' in the plan view of FIG. 10, whereas the cross-sectional view of FIG. 11 is taken along line B-B' in the plan view of FIG. 11.

Referring to FIGS. 10 and 11, a display panel 200 according to the comparative aspect includes a substrate 210, a transistor layer 220 located on the substrate, a planarization layer 230 located on the transistor layer 220, a light-emitting device layer 240 located on the planarization layer 230, a first encapsulation layer 250 located on the light-emitting device layer 240, a touch sensor layer 260 located on the first encapsulation layer 250, and a second encapsulation layer 270 located on the touch sensor layer 260. The first encapsulation layer 250 includes a first insulating film 251. The first insulating film 251 is an organic layer planarizing the light-emitting device layer 240. The second encapsulation layer 270 includes a second insulating film 271. The second insulating film 271 is an organic layer planarizing the touch sensor layer 260.

The light-emitting device layer 240 includes a light-emitting device 241. The light-emitting device 241 includes a pixel electrode 241a and a common electrode 241b. The light-emitting device 241 may further include an emissive layer (not shown) located between the pixel electrode 241 and the common electrode 241b.

The light-emitting device layer 240 includes a bank layer 242. The bank layer 242 may be a layer having an opening for the pixel electrode 241a, and may be a layer defining emissive areas of the subpixels of the display panel 200.

Referring to FIG. 10, the display panel 200 according to the comparative aspect is configured such that first display wiring 221, second display wiring 222, and third display wiring 261 are located in the pixel area 112, i.e., the non-transmission area NTA, in order to obtain the transmittance of the transmission area TA.

Referring to FIG. 11, the display panel 200 according to the comparative aspect is configured such that first display wiring 221, second display wiring 222, and a third display wiring 261 are located in the wiring area 113, i.e., the non-transmission area NTA, in order to obtain the transmittance of the transmission area TA.

However, referring to FIGS. 10 and 11, the display panel 200 according to the comparative aspect including the first insulating film 251 that is located in the entire area of the display panel 200 and overlaps with the transmission area TA. Thus, the display panel 200 has a drawback in that the transmittance of the transmission area TA is reduced due to the first insulating film 251, i.e., an organic film relatively thicker than the other layers.

In addition, referring to FIG. 11, in the transistor layer 220 of the display panel 200, since the plurality of the first display wiring 221 and the plurality of second display wiring 222 are located in the wiring area 113, the capability of reducing the area of the wiring area 113 in order to obtain a sufficient space between the lines (i.e., wires) is limited. Thus, the transmittance of the first active area of the display panel 200 is lower than that of the wiring area 113.

Figure 12:
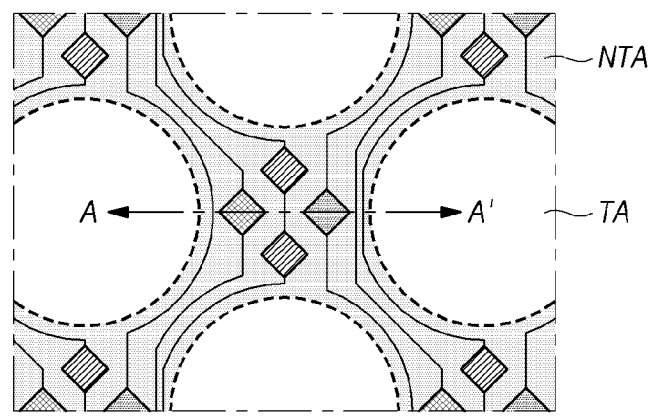
FIGS. 12 to 14 are plan and cross-sectional views illustrating the display panel according to the present disclosure.
Figure 12:
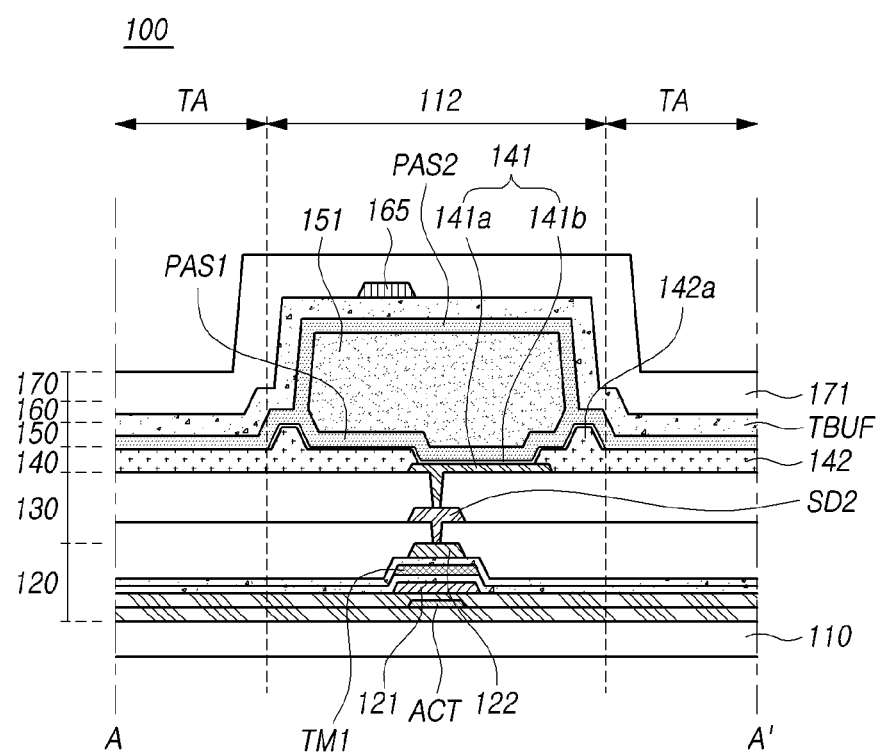

FIG. 12 is a plan view and a cross-sectional view illustrating a display panel 100 according to the present disclosure.

The cross-sectional view of FIG. 12 is taken along line A-A' in the plan view of FIG. 12. That is, the cross-sectional view of FIG. 12 illustrates the cross-section of a portion of the transmission area and the cross-section of a portion of the pixel area in the display panel 100.

Referring to FIG. 12, the display panel 100 includes a substrate 110, a transistor layer 120 located on the substrate 110, a planarization layer 130 located on the transistor layer 120, a light-emitting device layer 140 located on the planarization layer 130, a first encapsulation layer 150 located on the light-emitting device layer 140, and a touch sensor layer 160 located on the first encapsulation layer 150.

The substrate 110 includes a plurality of subpixels. In addition, the substrate 110 includes a first active area and a second active area. The number of subpixels per unit area in the first active area is smaller than number of subpixels per unit area in the second active area. Details regarding the first active area and the second active area are the same as those described above with reference to FIGS. 6 to 8.

Referring to FIG. 12, the first active area includes a pixel area 112, a wiring area, and a transmission area TA.

The transistor layer 120 includes first display wiring 121 and second display wiring 122.

The first display wiring 121 may be, for example, a data line, a driving voltage line, a common voltage line, or a reference voltage line.

The second display wiring 122 may be, for example, a gate line, a scan line, or a sensing line.

For example, the first display wiring 121 may be a data line, whereas the second display wiring 122 may be a gate line.

The transistor layer 120 may include a plurality of transistors and a plurality of capacitors of a subpixel circuit, and may include a plurality of insulating films.

The transistor layer 120 may include a line ACT made from a material of a semiconductor layer of the transistor and a line TM1 made from a material of the gate electrode of the transistor. Although TM1 is designated with a reference numeral separate from the second display wiring 122 in FIG. 12, at least one of the line indicated with the reference numeral TM1 and the line indicated with 122 in FIG. 12 may be the second display wiring.

The planarization layer 130 may be a layer planarizing the transistor layer 120 and be located between the light-emitting device layer 140 and the transistor layer 120. The planarization layer 130 may include at least one insulating film.

The planarization layer 130 may include, for example, a pattern SD2 electrically connecting a line located in the transistor layer 120 and the pixel electrode 141a located in the light-emitting device layer 140.

Although the pattern SD2 is designated with a reference numeral separate from the first display wiring 121 in FIG. 12, at least one of the line designated with the reference numeral SD2 and the line designated with 121 in FIG. 12 may be the first display wiring.

The planarization layer 130 may be an organic layer planarizing the transistor layer 120, and may be located to not overlap with the transmission area TA. Although not shown in the drawings, none of the light-emitting device 141 and the signal lines are located in the transmission area TA. Thus, the planarization layer 130 planarizing the transistor layer 120 may not be located on the transistor layer 120 before the light-emitting device 141 is formed on the transistor layer 120. When the planarization layer 130 is not located on the transmission area TA, the transmittance of the transmission area TA may be further increased.

The light-emitting device layer 140 includes a plurality of light-emitting devices 141.

The light-emitting device layer 140 may include the common electrode 141b, and the common electrode 141b may be located to not overlap with the transmission area TA. When the common electrode 141b is located to not overlap with the transmission area TA, the transmittance of the transmission area TA may be further increased.

The light-emitting device layer 140 may include a bank layer 142. The bank layer 142 may be a layer located between the pixel electrode 141a and the common electrode 141b, and may have an open area corresponding to the pixel electrode 141a. The emissive areas of the subpixels may be defined by the open areas of the bank layer 142.

The first encapsulation layer 150 includes a first insulating film 151. The first encapsulation layer 150 may be a layer preventing external oxygen or moisture from infiltrating into the light-emitting device 141, and may be a single layer or a multilayer.

The first encapsulation layer 150 may be a multilayer. For example, the first encapsulation layer 150 may further include an organic layer or an inorganic layer, in addition to the first insulating film 151. Referring to FIG. 12, the first encapsulation layer 150 may include a third insulating film PAS1 and a fourth insulating film PAS2. The third insulating film PAS1 and a fourth insulating film PAS2 may be, for example, inorganic layers, and may be made from different materials or the same material.

The first insulating film 151 is located to not overlap with the transmission area TA. Since the first insulating film 151 is located to not overlap with the transmission area TA, the transmittance of the transmission area TA may be improved.

The first insulating film 151 may be an organic layer planarizing the light-emitting device layer 140. Since the organic layer planarizing the light-emitting device layer 140 is relatively thicker than the other layers, when the first insulating film 151 is an organic layer planarizing the light-emitting device layer 140, the first insulating film 151 may be located to not overlap with the transmission area TA, thereby significantly improving the transmittance of the transmission area TA.

When the first insulating film 151 is an organic layer, the first insulating film 151 is not limited to a specific type as long as the first insulating film 151 is an organic layer used in encapsulating the light-emitting devices. For example, the organic layer may be an optically-transparent acrylic adhesive layer.

The bank layer 142 may include dams 142a. The dams 142a may be located on peripheral portions of the first insulating film 151 in the pixel area. Since the first insulating film 151 is a layer encapsulating the light-emitting devices, the first insulating film 151 may be provided to correspond to the pixel area 112, and the dams 142a may be located on the boundary of the pixel area 112 while surrounding the pixel area 112. Although the two dams 142a are illustrated in FIG. 2, the bank layer 142 may also include a single dam 142a or three or more dams 142a.

The touch sensor layer 160 may include a touch electrode 165. The touch electrode 165 may be located on a buffer film TBUF included in the touch sensor layer 160.

The display panel 100 may include the second encapsulation layer 170 located on the touch sensor layer 160.

The second encapsulation layer 170 may include a second insulating film 171. The second insulating film 171 may be an organic layer planarizing the touch sensor layer 160. The organic layer is not specifically limited as long as the organic layer may planarize the touch sensor layer 160. For example, the organic layer may be an optically-transparent acrylic adhesive layer.

The second insulating film 171 may be an organic layer planarizing third display wiring 161 and fourth display wiring 162. Although not shown in the drawings, the second insulating film 171 may be located to not overlap with the transmission area TA. When the second insulating film 171 is located to not overlap with the transmission area TA, the transmittance of the transmission area TA may be further improved.

Figure 13:
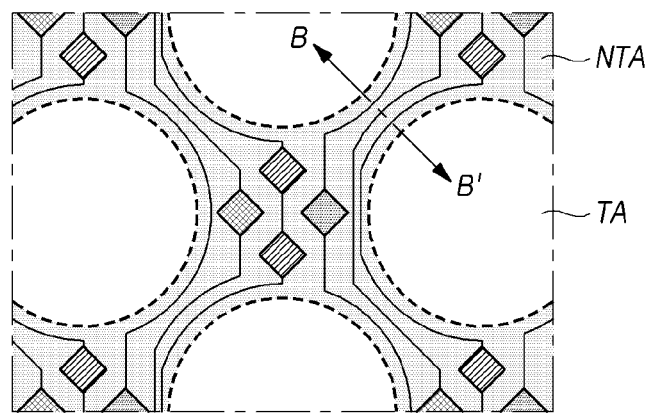
Figure 13:
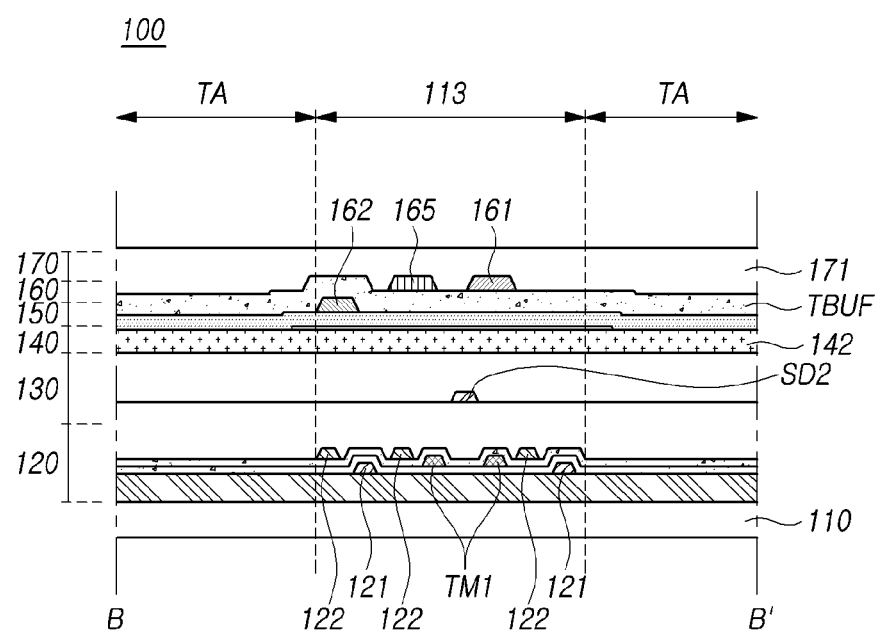

FIG. 13 is a plan view and a cross-sectional view illustrating the display panel 100 according to aspects of the present disclosure.

The cross-sectional view of FIG. 13 is taken along line A-A' in the plan view of FIG. 13. That is, the cross-sectional view of FIG. 13 illustrates the cross-section of a portion of the wiring area and the cross-section of a portion of the transmission area in the display panel 100.

As described above with reference to FIGS. 2 to 4, the touch sensor layer of the display panel may include the touch electrodes for detecting a touch-based input, the bridges, and the like. For example, the touch sensor layer of the display panel may include first touch wiring and second touch wiring. The first touch wiring may be located in a different layer from the second touch wiring. The first touch wiring may be the touch electrodes, whereas the second touch wiring may be a bridge pattern electrically connecting the first touch wiring.

Referring to FIG. 13, the touch sensor layer 160 includes the third display wiring 161 and the fourth display wiring 162. The third display wiring 161 and the fourth display wiring 162 are the lines for driving the subpixels rather than being the touch electrodes for detecting a touch-based input or the bridges. For example, each of the third display wiring 161 and the fourth display wiring 162 may be a data line, a driving voltage line, a common voltage line, a reference voltage line, a gate line, a scan line, or a sensing line.

When the touch sensor layer 160 includes the third display wiring 161 and the fourth display wiring 162, i.e., the display wiring for driving the subpixels, the size of the wiring area 113 may be reduced to be smaller than that of the display panel according to the comparative aspect in which all of the display wiring are disposed in the transistor layer 120. Thus, the transmittance of the first active area may be improved.

The third display wiring 161 may be made from the same material as the first touch line. For example, the first touch line may be the touch electrode, and the third display wiring 161 and the touch electrode may be made from the same material. The first touch line and the third display wiring 161 may be located on the same layer. Thus, in a process of forming the first touch line in the touch sensor layer 160 without an additional operation, the third display wiring 161 may be formed in the touch sensor layer 160.

The fourth display wiring 162 may be made from the same material as the second touch line. For example, the second touch line may be the bridge, and the fourth display wiring 162 and the bridge may be made from the same material. The second touch line and the fourth display wiring 162 may be located on the same layer. Thus, in a process of forming the second touch line in the touch sensor layer without an additional operation, the fourth display wiring 162 may be formed in the touch sensor layer 160.

Figure 14:
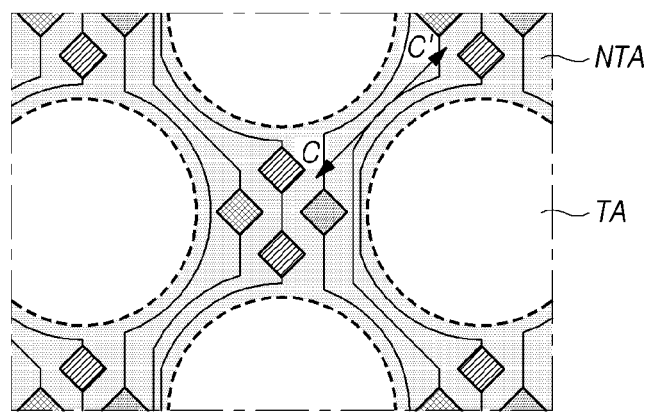
Figure 14:
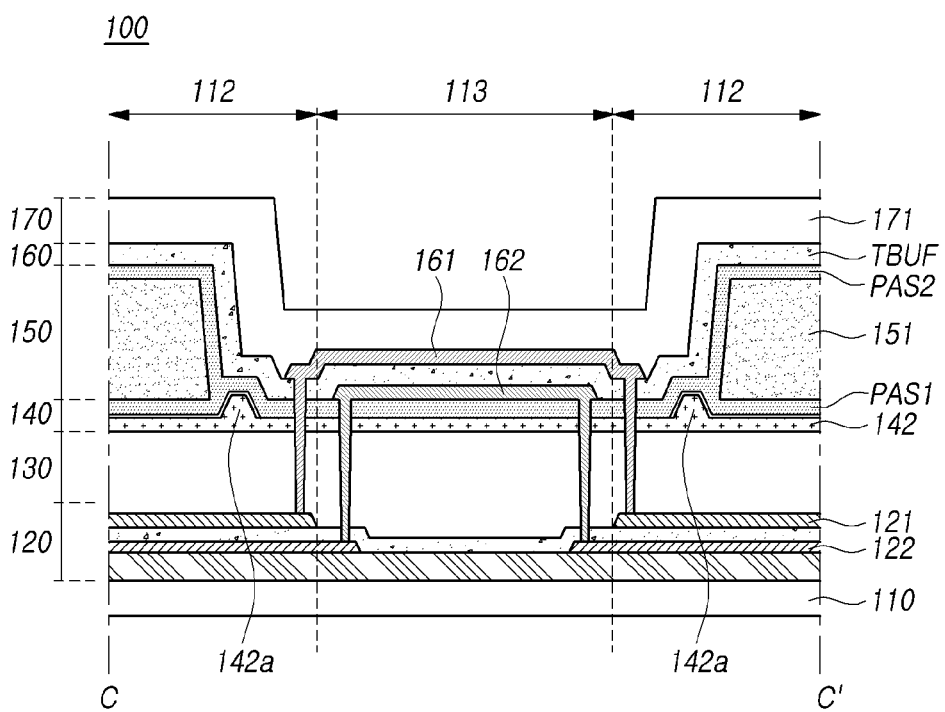

FIG. 14 is a plan view and a cross-sectional view illustrating the display panel 100 according to the present disclosure.

The cross-sectional view of FIG. 14 is taken along line C-C' in the plan view of FIG. 14. That is, the cross-sectional view of FIG. 14 illustrates the cross-section of a portion of the wiring area and the cross-section of a portion of the pixel area in the display panel 100.

Referring to FIG. 14, the third display wiring 161 may be in contact with the first display wiring 121 through a contact hole. For example, the third display wiring 161 may be in contact with the first display wiring 121 through the contact hole, at the boundary between the wiring area 113 and the pixel area 112. Thus, a signal applied to the first display wiring 121 may be transferred through the third display wiring 161 in the wiring area 113.

The fourth display wiring 162 is in contact with the second display wiring 122 through the contact hole. For example, the fourth display wiring 162 may be in contact with the second display wiring 122, at the boundary between the wiring area 113 and the pixel area 112. Thus, a signal applied to the second display wiring 122 may be transferred through the fourth display wiring 162 in the wiring area 113.

Referring to FIGS. 12 to 14, the light-emitting device 141, the first display wiring 121, and the second display wiring 122 may be located in the pixel area 112. Since the light-emitting device 141 is located in the pixel area 112 and the first display wiring 121 and the second display wiring 122 for driving the light-emitting device are located in the pixel area 112, the light-emitting device 141 can operate in the pixel area 112.

The light-emitting device 141 may not be located in the wiring area 113, but the first display wiring 121, the second display wiring 122, the third display wiring 161, and the fourth display wiring 162 may be located in the wiring area 113. That is, the wiring area 113 is not an area in which the light-emitting device 141 operates, but the lines for driving the light-emitting device 141 located in the pixel area 112 may be disposed in the wiring area 113.

Since the first display wiring to the fourth display wiring may be made from an opaque material, the area in which at least one of the first display wiring to the fourth display wiring are located may be a non-transmission area.

The light-emitting device 141, the first display wiring 121, the second display wiring 122, the third display wiring 161, and the fourth display wiring 162 may not be located in the transmission area TA. Since none of the first display wiring to the fourth display wiring that may contain an opaque material may be located in the transmission area TA, the transmittance of the transmission area TA may be improved.

According to another aspect, aspects of the present disclosure may provide a display device including the display panel and a control circuit.

In the display device according to aspects of the present disclosure, details of the display panel are the same as those of the above-described display panel according to aspects of the present disclosure.

The above description has been presented to enable any person skilled in the art to make and use the technical idea of the present disclosure, and has been provided in the context of a particular application and its requirements. Various modifications, additions and substitutions to the described aspects will be readily apparent to those skilled in the art, and the general principles defined herein may be applied to other aspects and applications without departing from the spirit and scope of the present disclosure. The above description and the accompanying drawings provide an example of the technical idea of the present disclosure for illustrative purposes only. That is, the disclosed aspects are intended to illustrate the scope of the technical idea of the present disclosure. Thus, the scope of the present disclosure is not limited to the aspects shown, but is to be accorded the widest scope consistent with the claims. The scope of protection of the present disclosure should be construed based on the following claims, and all technical ideas within the scope of equivalents thereof should be construed as being included within the scope of the present disclosure.

What is claimed is:

1. A display panel comprising:
a substrate including a plurality of subpixels, a first active area and a second active area, wherein the number of subpixels per unit area in the first active area is smaller than the number of subpixels per unit area in the second active area, the first active area comprising a pixel area, a wiring area and a transmission area;
a transistor layer located on the substrate and including a first display wiring and a second display wiring;
a planarization layer located on the transistor layer;
a light-emitting device layer located on the planarization layer and including a plurality of light-emitting devices;
a first encapsulation layer located on the light-emitting device layer and including a first insulating film; and
a touch sensor layer located on the first encapsulation layer and including a third display wiring and a fourth display wiring,
wherein the first insulating film does not overlap with the transmission area,
wherein the third display wiring is in electrical contact with the first display wiring through a first contact hole, and
wherein the fourth display wiring is in electrical contact with the second display wiring through a second contact hole.

2. The display panel of claim 1, wherein the touch sensor layer further includes a first touch wiring and a second touch wiring, and
wherein the first touch wiring is made from a same material as the third display wiring, and the second touch wiring is made from a same material as the fourth display wiring.

3. The display panel of claim 2, wherein the first touch wiring and the second touch wiring are located on different layers, and wherein the second touch wiring has a bridge pattern electrically connecting the first touch wiring.

4. The display panel of claim 1, wherein the first insulating film including an organic layer planarizing the light-emitting device layer.

5. The display panel of claim 1, further comprising a second encapsulation layer located on the touch sensor layer and includes a second insulating film, wherein the second insulating film planarizes the third display wiring and the fourth display wiring, and the second insulating film does not overlap with the transmission area.

6. The display panel of claim 1, wherein the planarization layer planarizing the transistor layer and does not overlap with the transmission area.

7. The display panel of claim 1, wherein the light-emitting device layer includes a common electrode that does not overlap with the transmission area.

8. The display panel of claim 1, wherein the light-emitting device layer includes a bank layer having dams located on peripheral portions of the first insulating film in the pixel area.

9. The display panel of claim 1, wherein the light-emitting devices, the first display wiring, and the second display wiring are located in the pixel area, wherein the first display wiring, the second display wiring, the third display wiring, and the fourth display wiring are located in the wiring area and the light-emitting devices are not located in the wiring area, and wherein the light-emitting devices, the first display wiring, the second display wiring, the third display wiring, and the fourth display wiring are not located in the transmission area.

10. A display panel comprising:

an active area including a pixel area, a wiring area surrounding the pixel area and a transmission area surrounded by the pixel area and the wiring area;

a transistor layer having a first display wiring and a second display wiring;

a planarization layer disposed on the transistor layer;

a light-emitting device layer disposed on the planarization layer and including a plurality of light-emitting devices;

a first encapsulation layer disposed on the light-emitting device layer and including a first insulating layer disposed inside the pixel area and third and fourth insulating layers surrounding the first insulating layer disposed in the pixel area; and a touch sensor layer disposed on the first encapsulation layer and including a third display wiring and a fourth display wiring, wherein the third display wiring is in electrical contact with the first display wiring through a first contact hole, and the fourth display wiring is in electrical contact with the second display wiring through a second contact hole.

11. The display panel of claim 10, wherein the touch sensor layer further includes a first touch wiring and a second touch wiring, and wherein the first touch wiring is made from a same material as the third display wiring, and the second touch wiring is made from a same material as the fourth display wiring.

12. The display panel of claim 11, wherein the first touch wiring and the second touch wiring are located on different layers, and wherein the second touch wiring has a bridge pattern electrically connecting the first touch wiring.

13. The display panel of claim 10, wherein the first insulating layer includes an organic layer planarizing the light-emitting device layer.

14. The display panel of claim 10, further comprising a second encapsulation layer located on the touch sensor layer and including a second insulating layer, wherein the second insulating film includes an organic layer planarizing the third display wiring and the fourth display wiring, and the second insulating layer does not overlap with the transmission area.

15. The display panel of claim 10, wherein the planarization layer includes an organic layer planarizing the transistor layer and does not overlap with the transmission area.

16. The display panel of claim 10, wherein the light-emitting device layer includes a common electrode located to not overlap with the transmission area.

17. The display panel of claim 10, wherein the light-emitting device layer includes a bank layer having dams located on peripheral portions of the first insulating layer in the pixel area.

18. The display panel of claim 10, wherein the light-emitting devices, the first display wiring, and the second display wiring are located in the pixel area, wherein the first display wiring, the second display wiring, the third display wiring, and the fourth display wiring are located in the wiring area and the light-emitting devices are not located in the wiring area, and wherein the light-emitting devices, the first display wiring, the second display wiring, the third display wiring, and the fourth display wiring are not located in the transmission area.

19. A display panel comprising:

an active area including a pixel area, a wiring area surrounding the pixel area and a transmission area surrounded by the pixel area and the wiring area;

a transistor layer having a first display wiring and a second display wiring;

a planarization layer disposed on the transistor layer;

a light-emitting device layer disposed on the planarization layer and including a plurality of light-emitting devices;

a first encapsulation layer disposed on the light-emitting device layer and including a first insulating film disposed in the pixel area, a third insulating layer disposed in the pixel area and the transmission area, and a fourth insulating layer disposed in the pixel area; and a touch sensor layer disposed on the first encapsulation layer and including a third display wiring and a fourth display wiring, wherein the third display wiring electrically contacts the first display wiring through a first contact hole disposed in the wiring area, and the fourth display wiring electrically contacts the second display wiring through a second contact hole disposed in the pixel area.

\* \* \* \* \*